United States Patent
Cho et al.

(10) Patent No.: US 9,488,977 B2
(45) Date of Patent: Nov. 8, 2016

(54) POWER STORAGE SYSTEM HAVING MODULARIZED BMS CONNECTION STRUCTURE AND METHOD FOR CONTROLLING THE SYSTEM

(71) Applicant: LG CHEM, LTD., Seoul (KR)

(72) Inventors: Young-Bo Cho, Daejeon (KR); Jung-Soo Kang, Daejeon (KR); Chan-Min Park, Daejeon (KR); Jong-Min Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 241 days.

(21) Appl. No.: 13/895,441

(22) Filed: May 16, 2013

(65) Prior Publication Data

US 2013/0253715 A1    Sep. 26, 2013

Related U.S. Application Data

(63) Continuation of application No. PCT/KR2012/003683, filed on May 10, 2012.

(30) Foreign Application Priority Data

May 31, 2011 (KR) .......................... 10-2011-0051802
May 10, 2012 (KR) .......................... 10-2012-0049592

(51) Int. Cl.
*G05D 3/12* (2006.01)
*G05D 5/00* (2006.01)
(Continued)

(52) U.S. Cl.
CPC ............ *G05B 23/02* (2013.01); *B60L 11/1851* (2013.01); *H01M 10/425* (2013.01);
(Continued)

(58) Field of Classification Search
CPC ...... H02J 7/00; H02J 7/0021; H01M 10/425; H01M 10/4207; H01M 2010/4278; H01M 2/1077; B60L 11/1851; G05B 23/02; H04Q 9/00; H04Q 2209/845; Y02T 10/7055; Y02T 90/16; Y02T 10/7005; Y02T 10/705; G01R 31/3689

USPC .............. 700/286; 429/50, 61; 320/118, 119
See application file for complete search history.

(56) References Cited

U.S. PATENT DOCUMENTS 6,104,967 A    8/2000 Hagen et al.
8,547,065 B2 * 10/2013 Trigiani ....................... 320/119
(Continued)

FOREIGN PATENT DOCUMENTS

EP    2204873 A1    7/2010
GB    2 341 258 A    3/2000
(Continued)

OTHER PUBLICATIONS

International Search Report issued in PCT/KR2012/003683, mailed on Nov. 1, 2012.
(Continued)

*Primary Examiner* — Mohammad Ali
*Assistant Examiner* — Ziaul Karim
(74) *Attorney, Agent, or Firm* — Birch, Stewart, Kolasch & Birch, LLP

(57) ABSTRACT

A power storage system includes n number of slave BMSs for transmitting data associated with an electric characteristic value of battery cells, included in battery modules managed by the slave BMSs, through slave communication networks; m number of master BMSs for primarily processing the data associated with an electric characteristic value of battery cells, transmitted through the slave communication networks, and transmitting the primarily processed data through a master communication network; and a super master BMS for secondarily processing the data transmitted through the master communication network. Since the data transmitted from each slave BMS are processed in a master BMSs, the amount of data loaded on a communication line may decrease. Therefore, even though the capacity of a power storage system increases, rapid data collection and data control may be achieved.

6 Claims, 4 Drawing Sheets

(51) Int. Cl.
  *G05B 23/02* (2006.01)
  *H04Q 9/00* (2006.01)
  *H01M 10/42* (2006.01)
  *B60L 11/18* (2006.01)
  *H02J 7/00* (2006.01)
  *G01R 31/36* (2006.01)
  *H01M 2/10* (2006.01)

(52) U.S. Cl.
  CPC ........ *H01M10/4207* (2013.01); *H02J 7/0021* (2013.01); *H04Q 9/00* (2013.01); *G01R 31/3689* (2013.01); *H01M 2/1077* (2013.01); *H01M 2010/4278* (2013.01); *H04Q 2209/845* (2013.01); *Y02T 10/7005* (2013.01); *Y02T 10/705* (2013.01); *Y02T 10/7055* (2013.01); *Y02T 90/16* (2013.01)

(56) References Cited

U.S. PATENT DOCUMENTS

| | | | |
|---|---|---|---|
| 2009/0066291 A1* | 3/2009 | Tien et al. | 320/118 |
| 2009/0146610 A1* | 6/2009 | Trigiani | H02J 7/0018 320/119 |
| 2009/0322154 A1 | 12/2009 | Ichikawa et al. | |
| 2010/0052615 A1* | 3/2010 | Loncarevic | 320/118 |
| 2012/0169291 A1* | 7/2012 | Abe | H01M 10/44 320/134 |
| 2012/0295139 A1* | 11/2012 | Jeong | H01M 10/48 429/50 |
| 2013/0099753 A1* | 4/2013 | Shu et al. | 320/134 |

FOREIGN PATENT DOCUMENTS

| | | |
|---|---|---|
| GB | 2463145 B | 10/2010 |
| JP | 2000-78759 A | 3/2000 |
| JP | 2001-511637 A | 8/2001 |
| JP | 2003-9405 A | 1/2003 |
| JP | 2003-17134 A | 1/2003 |
| JP | 2003-153440 A | 5/2003 |
| JP | 2008-35665 A | 2/2008 |
| JP | 2009-168720 A | 7/2009 |
| JP | 2010-063259 A | 3/2010 |
| KR | 10-0680901 B1 | 2/2007 |
| KR | 10-2010-0098550 A | 9/2010 |
| WO | WO 2011/043172 A1 | 4/2011 |

OTHER PUBLICATIONS

Written Opinion of the International Searching Authority issued in PCT/KR2012/003683, mailed on Nov. 1, 2012.
Japanese Office Action dated Mar. 23, 2015 with English translation.

* cited by examiner

POWER STORAGE SYSTEM HAVING MODULARIZED BMS CONNECTION STRUCTURE AND METHOD FOR CONTROLLING THE SYSTEM

CROSS-REFERENCE TO RELATED APPLICATION

The present application is a continuation of International Application No. PCT/KR2012/003683 filed on May 10, 2012, which claims priority to Korean Patent Application No. 10-2011-0051802 filed in the Republic of Korea on May 31, 2011 and Korean Patent Application No. 10-2012-0049592 filed in the Republic of Korea on May 10, 2012, the disclosures of which are incorporated herein by reference.

TECHNICAL FIELD

The present disclosure relates to a power storage system configured by assembling a plurality of power storage unit racks, and more particularly, to a connection structure of modularized BMSs included in each unit rack and its control method.

BACKGROUND ART

A secondary battery has high applicability depending on the product group and excellent electric characteristics such as high energy density, and thus not only commonly applied to mobile devices, but also electric vehicles (EV), hybrid electric vehicles (HEV) or the like, driven by an electric power source. Such a secondary battery significantly reduces the use of the fossil fuels and does not generate by-products caused by the use of energy. Therefore, secondary batteries are drawing attention as an eco-friendly alternative energy source with improved energy efficiency.

A secondary battery includes a cathode current collector, an anode current collector, a separator, an active material, a liquid electrolyte, etc., and has a chargeable and dischargeable structure due to the electro-chemical reaction among the components. Meanwhile, since recently a secondary battery is frequently used as an energy storing source and the need of a battery structure having a large capacity is increasing, a secondary battery pack with a multi-module structure having a plurality of the secondary batteries connected to each other in series or in parallel is commonly used.

A secondary battery pack used in a power storage system includes a secondary battery module having a plurality of secondary battery cells aggregated therein and a pack case. In addition to this fundamental structure, a secondary battery pack further includes a Battery Management System (BMS) for monitoring and controlling the status of a secondary battery cell or a secondary battery module by applying an algorithm for controlling power supply to a load, measuring an electric characteristic value such as current, voltage or the like, controlling charge or discharge, controlling equalization of voltage, estimating stage of charge (SOC), etc.

Meanwhile, in order to meet various voltage and capacity requirements, a power storage system may be configured by assembling small-capacity power storage unit racks, each having a plurality of secondary battery packs as described above, in series or in parallel. Recently, since a smart grid is at the center of interest, the need for a large-capacity power storage system storing unused power is increasing to implement an intelligent power network.

A power storage unit rack includes a plurality of secondary battery packs and each secondary battery pack includes a plurality of secondary battery cells or modules therein. A plurality of such power storage unit racks is connected to each other depending on the demanded capacity of a power storage system. In other words, a power storage system includes several tens or thousands of secondary battery cells or modules therein. In order to operate the power storage system, voltage, current, temperature, SOC, or the like of the several tens or thousands of cells or modules should be continuously monitored.

For monitoring the status of each secondary battery cell or module and efficiently controlling the cell or module, correlations of BMSs included in the battery packs are set, so that BMSs included in the battery packs are set to slave BMSs, and a separate BMS capable of controlling the slave BMSs is set to a master BMS to integrally operate and control the power storage system.

Meanwhile, the concept of a power storage system recently tends to broaden beyond a single house or office, namely to a large building, a small district, a city, or a nation, like a smart grid. However, the conventional method described above should possess and manage individual hardware mechanisms or software driving mechanisms, as much as slave BMSs included in a secondary battery pack. Also, as the capacity of a power storage system increases, the conventional method takes more time to allow a master BMS to receive information from each slave BMS and process the information. That is, the conventional method is not sensitive to external changes and fails to achieve energy efficiency, which is an inherent advantage of the smart grids.

Therefore, there is an increasing need for developing a power storage system having a BMS connection structure where BMSs may be installed for each cell, module or pack and integrally managed with efficiency, and its control method.

DISCLOSURE

Technical Problem

The present disclosure is designed to solve the problems of the conventional technology, and therefore, it is an object of the present disclosure to provide a power storage system having a connection structure of modularized BMSs, and a method for controlling the system.

Technical Solution

In order to accomplish the above object, the present disclosure provides a power storage system comprising n number of slave BMSs for transmitting data associated with an electric characteristic value of battery cells, included in battery modules managed by the slave BMSs, through slave communication networks; m number of master BMSs for primarily processing the data associated with an electric characteristic value of battery cells, transmitted through the slave communication networks, and transmitting the primarily processed data through master communication networks; and a super master BMS for secondarily processing the data transmitted through the master communication networks.

According to the present disclosure, the electric characteristic value includes at least one value selected from a measured voltage, a measured charge or discharge current, a measured temperature, an estimated charge amount and an estimated degradation degree of a battery cell.

According to the present disclosure, the master BMS or the super master BMS processes data by using at least one calculation method selected from calculating an average value of the received data, calculating a standard deviation thereof, calculating the number of data corresponding to a predetermined condition therefrom, calculating a maximum value thereof and calculating a minimum value thereof.

According to an aspect of the present disclosure, the master BMS is any one selected from the n number of slave BMSs, and the super master BMS is any one selected from the m number of master BMSs.

The power storage apparatus according to the present disclosure may further comprise: an external monitoring device for receiving the secondarily processed data from the super master BMS and transmitting a control signal, generated based on the secondarily processed data, to the super master BMS. In this case, the super master BMS outputs a master control signal through the master communication network to control the master BMSs based on the control signal received from the external monitoring device. Also, the master BMSs output slave control signals through the slave communication networks to control the slave BMSs based on the master control signal received from the super master BMS.

In order to accomplish the object according to the present disclosure, there is provided a method for controlling a power storage system having n number of slave BMSs, m number of master BMSs and a super master BMS, the method comprising: (a) allowing the n number of slave BMSs to transmit data associated with an electric characteristic value of battery cells, included in battery modules managed by the slave BMSs, through slave communication networks; (b) allowing the m number of master BMSs to primarily process the data associated with an electric characteristic value of battery cells, transmitted through the slave communication networks, and to transmit the processed data through master communication networks; and (c) allowing the super master BMS to secondarily process the data transmitted through the master communication networks.

Advantageous Effects

According to an aspect of the present disclosure, since the data transmitted from a plurality of slave BMSs are processed in a master BMS, the amount of data loaded on a communication line may decrease. Therefore, even though the capacity of a power storage system increases, rapid data collection and data control may be achieved.

In accordance with another aspect of the present disclosure, modularized BMSs corresponding to a plurality of cell modules included in a power storage unit rack of a power storage system, may be integrally controlled with efficiency, and the load on an external monitoring device, which integrally manages the power storage system, may be distributed and reduced.

DESCRIPTION OF DRAWINGS

Other objects and aspects of the present disclosure will become apparent from the following descriptions of the embodiments with reference to the accompanying drawings in which.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
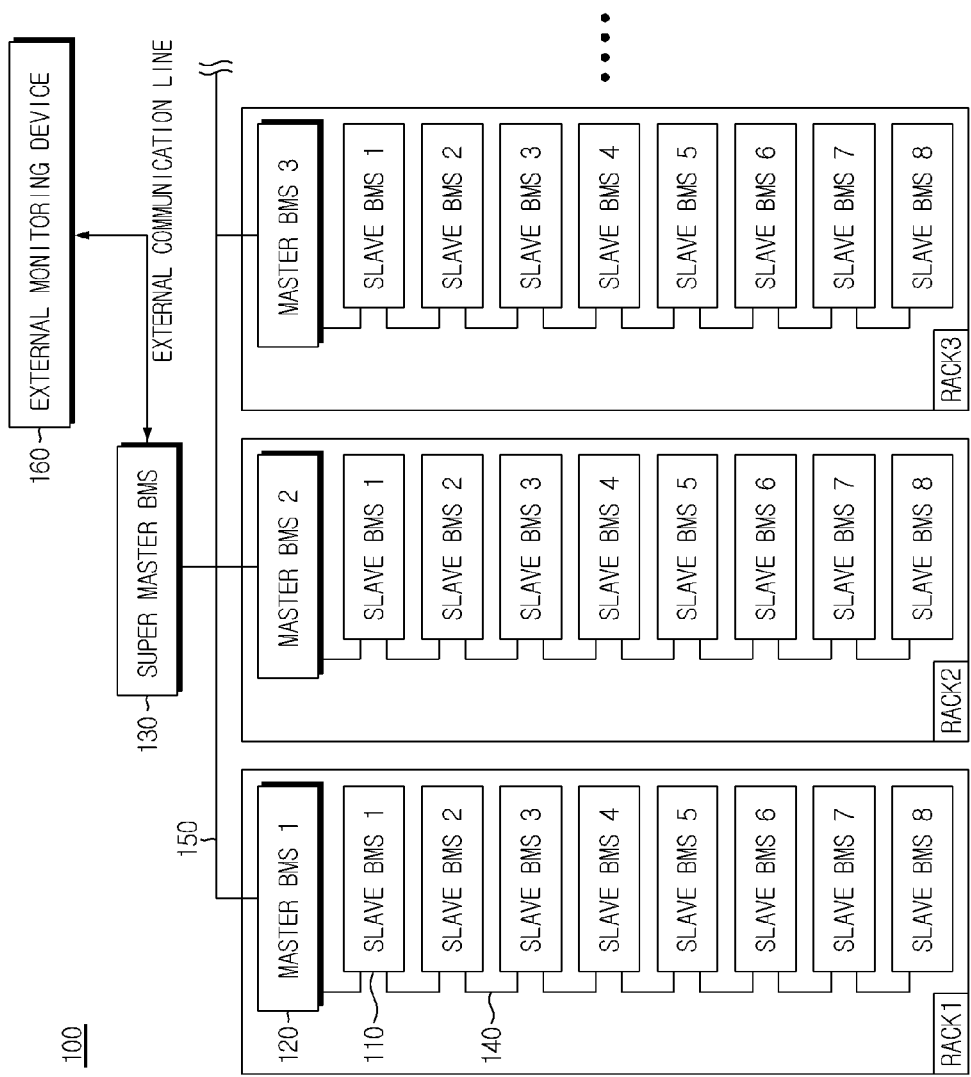
FIG. 1 is a schematic block diagram showing a connection structure of a power storage system according to an embodiment of the present disclosure.

FIG. 1 is a schematic block diagram showing a connection structure of a power storage system 100 according to an embodiment of the present disclosure.

Referring to FIG. 1, the power storage system 100 according to the present disclosure includes slave BMSs 110, master BMSs 120, and a super master BMS 130. The power storage system 100 further includes slave communication networks 140, each allowing data transmission between the slave BMSs 110 and a single master BMS 120, and a master communication networks 150 allowing data transmission between the master BMSs 120 and the super master BMS 130.

Each slave BMS 110 collects an electric characteristic value of battery cells, included in battery modules managed by the slave BMS. The electric characteristic value represents the status of each battery cell and may have at least one value selected from a measured voltage, a measured charge or discharge current, a measured temperature, an estimated charge amount and an estimated degradation degree of a battery cell.

According to a control command of the master BMS 120 or a predetermined cycle, the slave BMS 110 measures the electric characteristic value of each battery cell, included in battery modules managed by the slave BMS. Then, the slave BMS 110 transmits the data associated with the measured electric characteristic value to the master BMS 120 through the slave communication network 140. Also, the slave BMS 110 may perform various control functions known in the art, such as controlling charge and discharge, controlling voltage equalization, or the like.

Each master BMS 120 receives and stores data transmitted through the slave communication network 140, and the data is associated with an electric characteristic value of battery cells. Also, the master BMS 120 processes the received data and transmits the processed data to the super master BMS 130 through the master communication network 150.

If the power storage system 100 according to the present disclosure is applied to a large-capacity smart grid, the number of battery racks increases in proportion to the demanded electrical power. Assume that m number of master BMSs 120 corresponding to the number of battery racks are presented, and each battery rack has n number of slave BMSs 110 therein. If each master BMS 120 transmits all of the data, received from the n number of slave BMSs 110 managed by the master BMS 120, to the super master BMS 130 with no data processing, the super master BMS 130 will receive m×n number of data. Thus, it will take much time for the super master BMS 130 to receive m×n number of data through a communication network and further take much time to process the received information and figure out the current status of the power storage system 100. As described above, if the super master BMS 130 spends so much time to receive data, the power storage system 100 may not appropriately cope with external conditions.

Accordingly, each master BMS 120 according to the present disclosure processes the data associated with an electric characteristics of battery cells, transmitted through the slave communication network 140, to reduce the amount of data. Then, the master BMS 120 transmits the processed data to the super master BMS 130.

As an embodiment of the data processing, the master BMS 120 may calculate an average value of the data received thereto. Assume the circumstance that the power storage system 100 supplies electric power to an electric grid. In this circumstance, in consideration of the amount of present electric power charged in each battery rack, the power storage system 100 needs to determine which battery rack is preferentially used to supply electric power. To achieve this, each slave BMS 110 transmits the data associated with the amount of charge of battery cells, managed by the corresponding slave BMS 110, to the master BMS 120 to which the slave BMS 110 belongs. Then, the master BMS 120 calculates an average value with respect to the amount of charge of each battery pack and transmits the average value to the super master BMS 130 to which the master BMS 120 belongs. The super master BMS 130 may be controlled to preferentially discharge the battery rack having the highest value, in consideration of the average value with respect to the amount of charge of each battery rack.

As another embodiment of the data processing, the master BMS 120 may calculate a standard deviation of the data received thereto. Assume the circumstance that the power storage system 100 performs voltage equalization for each battery rack. The power storage system 100 needs to determine which battery rack preferentially needs voltage equalization. To achieve this, the master BMS 120 calculates a standard deviation with respect to the amount of charge in each battery pack, transmitted from the slave BMSs 110, and transmits the standard deviation to the super master BMS 130 to which the master BMS 120 belongs. Then, the super master BMS 130 may be controlled to preferentially perform voltage equalization for the battery rack having the highest standard deviation with respect to the amount of charge.

As another embodiment of the data processing, the master BMS 120 may calculate the value associated to the number of data which corresponds to a predetermined condition, among the data received from the slave BMSs 110. For example, the master BMS 120, which has received the data associated with an estimated deterioration degree of each battery cell from the slave BMSs 110, calculates the number of battery packs having an estimated deterioration degree of 60% or less. Then, the master BMS 120 transmits the calculated number of battery packs to the super master BMS 130 to which the master BMS 120 belongs. In this case, by using the data associated with the battery rack having more battery cells with an estimated deterioration degree of 60% or less, the super master BMS 130 may be controlled to regulate the amount of charge or discharge of the power storage system 100.

The data processing may be performed to reduce the amount of data by using methods well known in the art, without being limited to the above embodiments such as calculating the maximum value of data or calculating the minimum value of data. Through the data processing, the amount of data to be transmitted to the super master BMS 130 will be reduced, and the time of which the received data is processed and determined by the super master BMS 130 will decrease due to the reduced amount of data. In the present disclosure, the data processing of the master BMSs 120 is called a 'primary data processing'.

The super master BMS 130 processes the data transmitted through the master communication network 150. Similar to the master BMSs 120, the super master BMS 130 may process the received data by using at least one calculation method selected from calculating an average value of the received data, calculating a standard deviation thereof, calculating the number of data corresponding to a predetermined condition therefrom, calculating a maximum value thereof and calculating a minimum value thereof. In the present disclosure, in order to distinguish from the data processing of the master BMSs 120, the data processing of the super master BMS 130 is called a 'secondary data processing'.

The master BMS 120 may be configured separately from the slave BMSs 110, but may be any one selected from the n number of slave BMSs 110. If the master BMS 120 is selected from the n number of slave BMSs 110, the master BMS 120 includes a slave BMS control algorithm and a master BMS control algorithm together.

Meanwhile, the super master BMS 130 may be configured separately from the master BMSs 120, but may be any one selected from the m number of master BMSs 120. If the super master BMS 130 is selected from the m number of master BMSs 120, the super master BMS 130 includes a master BMS control algorithm and a super master BMS control algorithm together.

The power storage system 100 according to the present disclosure further includes an external monitoring device 160 for receiving secondarily processed data from the super master BMS 130 and transmitting a control signal, generated based on the secondarily processed data, to the super master BMS 130. The external monitoring device may be a device which displays the status of the power storage system 100 to users or managers and transmits control signals input by the users or managers to the super master BMS 130. Also, the external monitoring device may be a device which receives secondarily processed data from the two or more super master BMSs 130 to control each power storage system 100.

The super master BMS 130 may output a master control signal to control the master BMSs 120 based on the control signal received from the external monitoring device 160.

As an embodiment, assume the circumstance that the super master BMS 130 transmits data, representing that the average value with respect to the amount of charge of battery racks is 50%, to the external monitoring device 160. The external monitoring device 160 determines that the average value with respect to the amount of charge of battery racks is lower than 70% and transmits a control signal to the super master BMS 130 to increase the average value associated with the amount of charge up to 70% through charging. Here, the control signal transmitted from the super master BMS 130 may include only a target value of the amount of charge and may not include a specific object or a performing method. Therefore, referring to the data associated with the amount of charge of each battery rack, received from the m number of master BMSs 120, the super master BMS 130 may determine which battery rack has 70% or less of the amount of charge and needs to be charged. That is, the super master BMS 130 may output a master control signal through the master communication network 150 to control the master BMSs 120 based on the control signal received from the external monitoring device 160. In the present disclosure, the control signal outputted from the super master BMS 130 is called a 'master control signal'.

In addition, the master BMS 120 may output a slave control signal to control the slave BMSs 110 based on the master control signal received from the super master BMS 130.

Subsequently, assume the circumstance that the super master BMS 130 determines that only battery racks #1 and #2 need to be charged. The super master BMS 130 outputs a master control signal to charge only the battery racks #1 and #2 among battery racks and increase the average amount of charge up to 70%. Then, only master BMSs #1 and #2 are charged among the m number of master BMSs 120. Here, the master control signal transmitted from the master BMSs 120 may include only a target value of the amount of charge and may not include a specific object or a performing method. Therefore, referring to the data associated with the amount of charge of each battery rack and received from the n number of slave BMSs 110, the master BMS 120 may determine which battery cells have an amount of charge of 70% or less to be charged, and thus the corresponding battery cells may be charged. That is, the master BMS 120 may output slave control signals through the slave communication networks 140 to control the slave BMSs 110 based on the master control signal received from the super master BMS 130. In the present disclosure, the control signal outputted from the master BMS 120 is called a 'slave control signal'.

Like the above embodiment, a superior BMS outputs control signals to subordinate BMSs, in the manner of delegating a specific control method or a specific control object to the subordinate BMSs. Such an output of the control signals corresponds to the reduction of the amount of data transmitted from the subordinate BMSs to the superior BMS through the data processing. That is, during the operation of the power storage system 100, the burden applied to the superior BMS may be reduced, so that more rapid and flexible operation may be performed.

Figure 2:
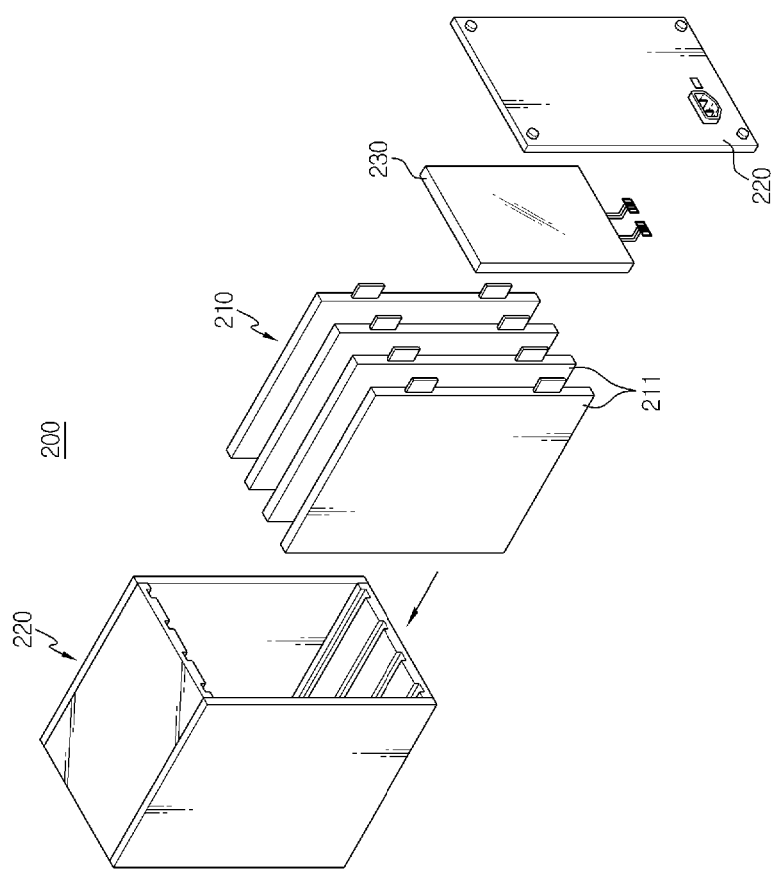
FIG. 2 is an exploded perspective view showing a battery pack according to an embodiment of the present disclosure.

FIG. 2 is an exploded perspective view showing a battery pack 200 according to an embodiment of the present disclosure.

Referring to FIG. 2, the battery pack 200 includes a battery module 210 in which a plurality of battery cells 211 is assembled, a battery pack case 220 and a Battery Management System 230 (BMS). The BMS 230 performs various control functions known in the art such as measuring an electric characteristic value including a voltage of each cell, controlling charge and discharge, controlling voltage equalization, estimating state of charge (SOC). If a fundamental unit of the power storage system 100 according to the present disclosure is a battery pack, the BMS 230 corresponds to a slave BMS. However, the battery pack 200 is just an embodiment of the present disclosure, and the scope of the present disclosure is not limited thereto.

Figure 3:
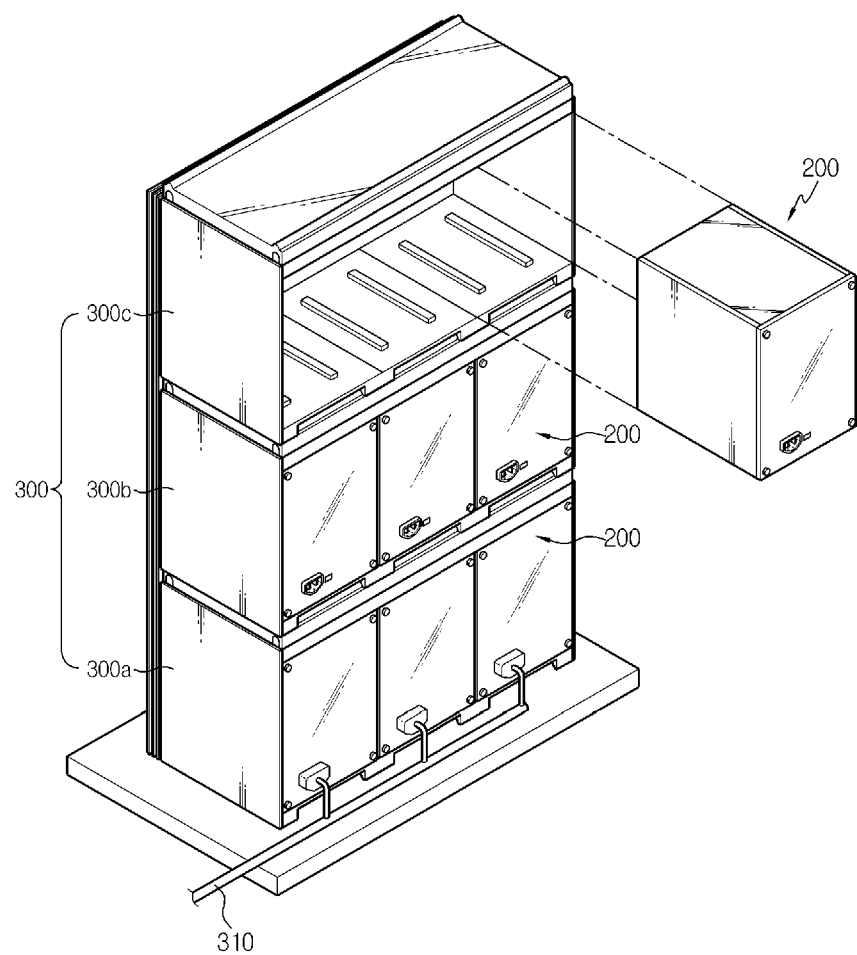
FIG. 3 is a perspective view showing a battery rack according to an embodiment of the present disclosure.

FIG. 3 is a perspective view showing a battery rack 300 according to an embodiment of the present disclosure.

Referring to FIG. 3, it is illustrated that the battery rack 300 stores three battery packs 200 in each of shelves 300a, 300b and 300c stacked in three levels. However, FIG. 3 is just an embodiment, and the number of battery packs 200 and the shelves 300a, 300b, 300c may be modified as desired.

In the battery rack 300 of FIG. 3, it is illustrated that the battery packs 200 in the bottom shelf 300a are connected with a power line 310 which may provide or receive electric power, and the battery packs 200 in the middle shelf 300b are completely installed while the power line 310 is not yet connected thereto. Also, the battery packs 200 in the top shelf 300c are being installed.

The power line 310 may be connected to all or a part of battery packs 200 as necessary, and battery packs 200 may not be mounted in a part of slots of the battery rack 300. Also, the battery rack 300 described above is just an embodiment and is not intended to limit the scope of the present disclosure.

The slave communication network 140 or the master communication network 150 may be a parallel communication network or a series communication network. Although FIG. 1 shows that the slave communication network 140 is a series communication network and the master communication network 150 is a parallel communication network, FIG. 1 is just an embodiment of the present disclosure and the present disclosure is not limited thereto.

If the slave communication network 140 or the master communication network 150 is a parallel communication network, the network may be a controlled area network (CAN). The CAN is widely known in the art, and thus it will not be described in detail here.

If the slave communication network 140 or the master communication network 150 is a serial communication network, the network may be a daisy chain. The daisy chain is also widely known in the art, and thus it will not be described in detail here.

Meanwhile, battery packs included in the battery rack may be connected to each other in series or in parallel. Also, battery racks may also be connected to each other in series or parallel. Accordingly, it is obvious to those skilled in the art that battery packs or battery racks of a power storage system 100 may be connected to each other in various ways based on demanded output voltage or electric power for charging or discharging.

Hereinafter, a method of controlling the power storage system, which corresponds to an aforementioned operation mechanism of the power storage system 100, will be described. The configuration of the power storage system 100, which has been already described above, will not be explained again.

Figure 4:
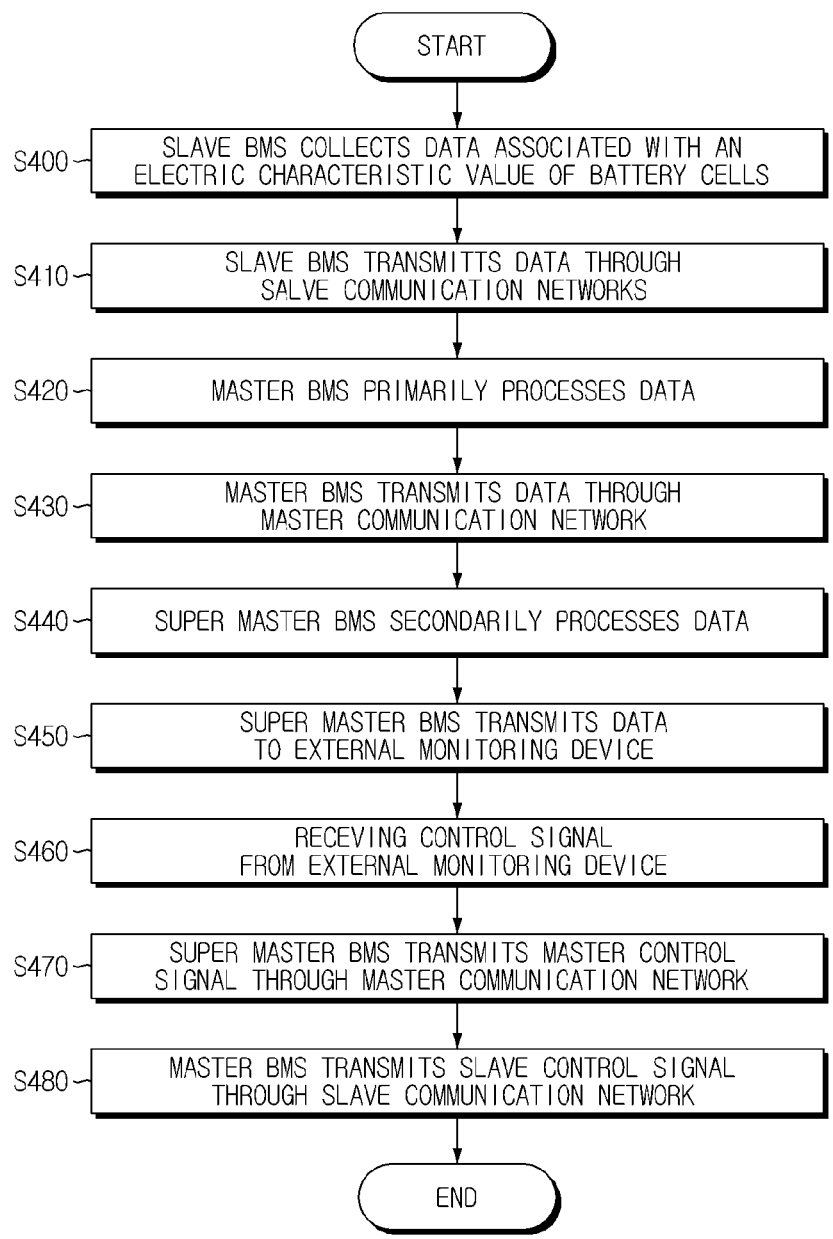
FIG. 4 is a flowchart for illustrating a method for controlling a power storage system according to an embodiment of the present disclosure.

FIG. 4 is a flowchart for illustrating a method for controlling a power storage system according to an embodiment of the present disclosure.

First, in step S400, each slave BMS 110 collects an electric characteristic value of the battery cells, included in battery modules managed by the slave BMS. Here, the collected electric characteristic value may include at least one value selected from a measured voltage, a measured charge or discharge current, a measured temperature, an estimated charge amount and an estimated degradation degree of a battery cell. Also, in step S410, the slave BMS 110 transmits the data associated with an electric characteristic value and collected through the slave communication network 140.

In step S420, each master BMS 120 primarily processes the data associated with an electric characteristic value of battery cells, transmitted through the slave communication network 140. The primary data processing is performed by using at least one method selected from calculating an average value of the received data, calculating a standard deviation thereof, calculating the number of data corresponding to a predetermined condition therefrom, calculating a maximum value thereof and calculating a minimum value thereof. Then, in step S430, the master BMS 120 transmits the processed data through the master communication network 150.

In step S430, the super master BMS 130 receives the data transmitted through the master communication network 150. In step S440, the super master BMS 130 secondarily processes the data received therein. Here, the super master BMS 130 also processes data by using at least one method selected from calculating an average value of the received data, calculating a standard deviation thereof, calculating the number of data corresponding to a predetermined condition therefrom, calculating a maximum value thereof and calculating a minimum value thereof.

The method for controlling a power storage system according to the present disclosure further includes a step S450 in which the super master BMS 130 transmits the secondarily processed data to the external monitoring device 160. The external monitoring device 160 has been described above and thus will not described in detail here.

In this case, in step S460, the super master BMS 130 receives a control signal, generated based on the secondarily processed data, from the external monitoring device 160. Then, in step S470, the super master BMS 130 outputs a master control signal through the master communication network 150 to control the master BMSs 120 based on the control signal received from the external monitoring device 160. In addition, in step S480, the master BMSs 120 output slave control signals through the slave communication networks 140 to control the slave BMSs 110 based on the master control signal received from the super master BMS 130. The master control signal and the slave control signal have been described above and thus will not described in detail here.

According to the present disclosure, since the data transmitted from a plurality of slave BMSs are processed in a master BMS, the amount of data loaded on a communication line may decrease. Therefore, even though the capacity of the power storage system increases, rapid data collection and data control may be achieved. Also, since modularized BMSs corresponding to a plurality of cell modules included in a power storage unit rack of a power storage system may be integrally controlled with efficiency, and the load on external monitoring device, which integrally manages a power storage system, may be distributed and reduced.

Meanwhile, each component of the power storage system of the present disclosure shown in FIG. 1 should be understood as a logically distinguishable component, rather than a physically distinguishable component.

In other words, since each component corresponds to a logic component for realizing the spirit of the present disclosure, even though components are integrated or divided, such an integrated or divided component should be understood as being included in the scope of the present disclosure if the function performed by a logic component of the present disclosure may be implemented. In addition, a component performing a function identical or similar to that of the present disclosure should be understood as being included in the scope of the present disclosure even though it may be titled differently.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A power storage system comprising:
   n number of slave Battery Management Systems for transmitting data associated with an electric characteristic value of battery cells, included in battery modules managed by the slave Battery Management Systems, through slave communication networks;
   m number of master Battery Management Systems for primarily processing the data associated with an electric characteristic value of battery cells, transmitted through the slave communication networks, to reduce the amount of data and transmitting the reduced amount of primarily processed data through master communication networks;
   the slave communication networks allowing communication (1) between members of a subset of slave Battery Management Systems and (2) between members of a subset of slave Battery Management Systems and one of the master Battery Management Systems, the master Battery Management System receiving data only from members of the subset of slave Battery Management Systems;
   a super master Battery Management System for secondarily processing the data transmitted through the master communication networks; and
   an external monitoring device for receiving the secondarily processed data from the super master Battery Management System and transmitting a control signal, generated based on the secondarily processed data, to the super master Battery Management System,
   wherein the primary and secondary processing of data is one of calculating an average, standard deviation, a maximum value and a minimum value.

2. The power storage system according to claim 1, wherein the super master Battery Management System outputs a master control signal through the master communication network to control the master Battery Management Systems based on the control signal received from the external monitoring device.

3. The power storage system according to claim 2, wherein the master Battery Management Systems output slave control signals through the slave communication networks to control the slave Battery Management Systems based on the master control signal received from the super master Battery Management System.

4. A method for controlling a power storage system having n number of slave Battery Management Systems, m number of master Battery Management Systems and a super master Battery Management System, the method comprising:
   allowing the n number of slave Battery Management Systems to transmit data associated with an electric characteristic value of battery cells, included in battery modules managed by the slave Battery Management Systems, through slave communication networks;
   allowing the m number of master Battery Management Systems to primarily process the data associated with an electric characteristic value of battery cells, transmitted through the slave communication networks, to reduce the amount of data and to transmit the reduced amount of processed data through master communication networks;
   allowing communication (1) between members of a subset of slave Battery Management Systems and (2) between members of the subset of slave Battery Management Systems through the slave communication networks and one of the master Battery Management Systems, the master Battery Management System receiving data only from members of the subset of slave Battery Management Systems;

allowing the super master Battery Management System to secondarily process the data transmitted through the master communication networks;

allowing the super master Battery Management System to transmit the secondarily processed data to an external monitoring device; and allowing the super master Battery Management System to receive a control signal, generated based on the secondarily processed data, from the external monitoring device, wherein the primary and secondary processing of data is one of calculating an average, standard deviation, a maximum value and a minimum value.

5. The method for controlling a power storage system according to claim 4, further comprising:

allowing the super master Battery Management System to output a master control signal through the master communication network to control the master Battery Management Systems based on the control signal received from the external monitoring device.

6. The method for controlling a power storage system according to claim 5, further comprising:

allowing the master Battery Management Systems to output a slave control signal through the slave communication networks to control the slave Battery Management Systems based on the master control signal received from the super master Battery Management System.

* * * * *